United States Patent
Haraguchi

(10) Patent No.: US 6,714,289 B2
(45) Date of Patent: Mar. 30, 2004

(54) SEMICONDUCTOR DEVICE INSPECTING APPARATUS

(75) Inventor: Koshi Haraguchi, Shizuoka (JP)

(73) Assignee: Suruga Seiki Co., Ltd., Shizuoka (JP)

( * ) Notice: Subject to any disclaimer, the term of this patent is extended or adjusted under 35 U.S.C. 154(b) by 10 days.

(21) Appl. No.: 10/227,241

(22) Filed: Aug. 26, 2002

(65) Prior Publication Data

US 2004/0016888 A1 Jan. 29, 2004

(30) Foreign Application Priority Data

Jul. 24, 2002 (JP) ........................................ 2002-214841

(51) Int. Cl.[7] .............................................. G01N 21/88
(52) U.S. Cl. ......................................................... 356/72
(58) Field of Search .......................... 250/306, 440.11; 324/765, 762, 754, 752; 438/14, 15; 356/237, 72

(56) References Cited

U.S. PATENT DOCUMENTS

| 5,355,252 A | * | 10/1994 | Haraguchi | ................. 359/369 |
|---|---|---|---|---|
| 6,128,073 A | * | 10/2000 | Henzler et al. | ................. 356/72 |
| 6,259,093 B1 | * | 7/2001 | Wakiyama et al. | ......... 250/306 |
| 6,269,322 B1 | * | 7/2001 | Templeton et al. | ......... 702/150 |
| 6,381,023 B1 | * | 4/2002 | Kempe | ....................... 356/484 |
| 6,384,898 B1 | * | 5/2002 | Inoue et al. | .................. 355/53 |
| 6,388,249 B2 | * | 5/2002 | Wakiyama et al. | ......... 250/234 |

\* cited by examiner

Primary Examiner—John R. Lee
Assistant Examiner—Johnnie L Smith, II
(74) Attorney, Agent, or Firm—Kanesaka & Takeuchi

(57) ABSTRACT

A semiconductor device inspecting apparatus includes a chamber, a stage situated in the chamber for placing a semiconductor device thereon, a femtosecond laser apparatus, and an electron microscope. The femtosecond laser apparatus includes a laser generating section for generating laser beams disposed outside the chamber, and a laser optical system for introducing the laser beams generated at the laser generating section into the chamber. The laser generating section generates femtosecond width pulse and a strength so that the semiconductor device on the stage is cut by the laser beams introduced inside the chamber. The electron microscope is disposed inside the chamber for observing the semiconductor device cut by the laser beams.

5 Claims, 6 Drawing Sheets

SEMICONDUCTOR DEVICE INSPECTING APPARATUS

BACKGROUND OF THE INVENTION

1. Field of the Invention

The present invention relates to a semiconductor device inspecting apparatus which cuts a semiconductor device and observes a cut cross section by an electron microscope, thereby analyzing a defective portion and observing a structure, etc. More particularly, the present invention relates to a semiconductor device inspecting apparatus capable of generating a sharp cut cross section.

2. Description of the Prior Art

Conventionally, as an apparatus for analyzing a defective portion in a developing process of a semiconductor device (LSI and the like), there is a known semiconductor device inspecting apparatus comprising a combination of an FIB (Focused Ion Beam) apparatus and a scanning electron microscope (SEM: Scanning Electron Microscope) (see Japanese Patent Application Laid-open No. H11-273613 for example).

According to this inspecting apparatus, a surface of the semiconductor device such as a semiconductor wafer is irradiated with FIB, thereby forming a fine groove or hole of submicron to micron size in the surface, or cutting the wafer, and the cross section is observed by the SEM, and analysis of defective portion or analysis by high resolution observation can be carried out.

There is also a known semiconductor device inspecting apparatus comprising a combination of the FIB apparatus and a transmission electron microscope (TEM: Transmission Electron Microscope). With this inspecting apparatus also, a semiconductor device such as a semiconductor wafer is irradiated with FIB to form a thin film sample, the sample is observed by the TEM, and evaluation of the semiconductor device or analysis of the defective portion can be carried out.

According to the above conventional semiconductor device inspecting apparatus, however, since the precision of working (such as cutting) by the FIB is affected by the atmosphere in a chamber (e.g., a temperature, a pressure) and the like, a worked surface (cut surface) does not appear sharply. Further, experience is required for working a wafer by the FIB in some cases. Furthermore, it takes time to work using the FIB and as a result, efficiency of the evaluation and analysis of the semiconductor device are inferior.

Further, according to the above-described semiconductor device inspecting apparatus, since a beam generating source of the FIB apparatus must be disposed in the chamber, a structure of the entire apparatus becomes complicated, and a producing cost is increased.

In addition, during driving operation of the FIB apparatus, since the sample (semiconductor device) is irradiated with ion beams, observation can not be carried out in real time using the SEM while working a fine defective portion using the FIB in some cases.

Further, according to the FIB apparatus, although the output is the same, a cutting depth is affected by the atmosphere in the chamber, characteristics of electromagnetic lens and the like, it is not easy to adjust the cutting depth.

SUMMARY OF THE INVENTION

It is a first object of the present invention to provide a semiconductor device inspecting apparatus capable of inspecting a semiconductor device precisely by forming a sharp working surface.

It is a second object of the present invention to provide a semiconductor device inspecting apparatus capable of enhancing the inspecting efficiency by working a semiconductor device within a short time.

It is a third object of the present invention to provide a semiconductor device inspecting apparatus in which its structure is not complicated.

It is a fourth object of the present invention to provide a semiconductor device inspecting apparatus capable of cutting and observing a working surface at the same time.

It is a fifth object of the present invention to provide a semiconductor device inspecting apparatus capable of always cutting uniformly without being affected by atmosphere in the chamber so much.

The present invention provides a semiconductor device inspecting apparatus comprising a stage disposed in a chamber on which a semiconductor device such as an LSI is set, a femtosecond laser apparatus for generating laser beams which cut the semiconductor device, and an electron microscope for observing a cut surface of the semiconductor device which was cut by the laser beams.

As the femtosecond laser apparatus, laser beams (titanium sapphire laser) of several tens to several hundreds fsec time width is used. "Cutting" in this invention includes formation of a groove and a hole in a surface of a semiconductor device such as an LSI, and cutting of the semiconductor device.

The femtosecond laser apparatus is used in the present invention. Therefore, it is possible to cut the semiconductor device at high speed, to cut the semiconductor device deeply, to make the depth uniformly, and to form a groove whose depth is changed at a predetermined-distance by changing a focus, distance of the laser beams during scanning. Further, since one dimensional or two dimensional cutting line can be controlled by a mirror provided in a laser optical path, it is possible to extremely shorten time required for cutting.

It is possible to cut the semiconductor device and to observe the working surface at the same time, and influence of atmosphere in the chamber is small, and the semiconductor device can always be cut uniformly.

The semiconductor device inspecting apparatus of the present invention uses a scanning electron microscope (SEM) or a transmission electron microscope (TEM).

In the semiconductor device inspecting apparatus of the invention, since the femtosecond laser apparatus is used as a laser beam source (i.e., an ion beam laser is not used), at least the laser generating section can be provided outside the chamber. With this feature, a structure of the semiconductor device inspecting apparatus is not complicated.

BRIEF DESCRIPTION OF THE DRAWINGS

FIGS. 3(A) and 3(B) show a cutting operation by femtosecond laser beams in the system shown in FIG. 2, wherein FIG. 3(A) shows a case in which a cutting depth is made constant by adjusting focus of the femtosecond laser beams, and FIG. 3(B) shows a case in which the cutting depth is changed;

FIGS. 6(a)–6(D) are explanatory views of operations of the system shown in FIG. 5, wherein FIG. 6(A) shows a cutting operation for taking out a predetermined portion of a sample, FIG. 6(B) shows a picking up operation of a sample piece by a probe of a manipulator, FIG. 6(C) shows an operation in which a sample piece is set on a sample fixer, and a thin film of the sample piece is worked by the femtosecond laser beams to form a thin film sample piece, and FIG. 6(D) shows an operation in which the thin film sample piece is sent to an observing position, of the TEM, and electron beams are allowed to pass through the cut surface to observe the cut surface.

DESCRIPTION OF THE PREFERRED EMBODIMENTS

Figure 1:
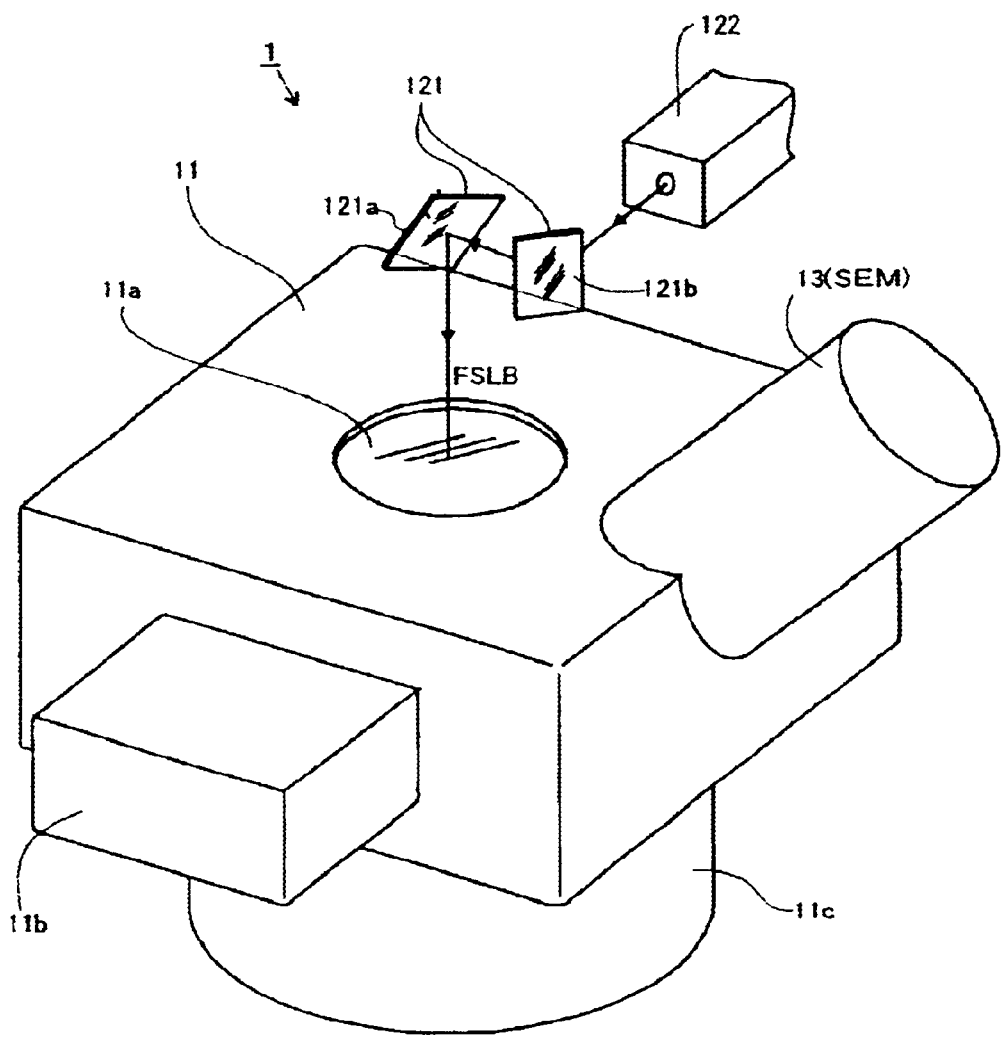
FIG. 1 is a diagram showing an example of an outward appearance of a semiconductor device inspecting apparatus of the present invention.

FIG. 1 is a diagram showing an example of an outward appearance of a semiconductor device Inspecting apparatus of the present invention. In FIG. 1, a semiconductor device inspecting apparatus 1 comprises a vacuum chamber 11, a femtosecond laser apparatus 12 and an SEM (scanning electron microscope) 13.

Figure 2:
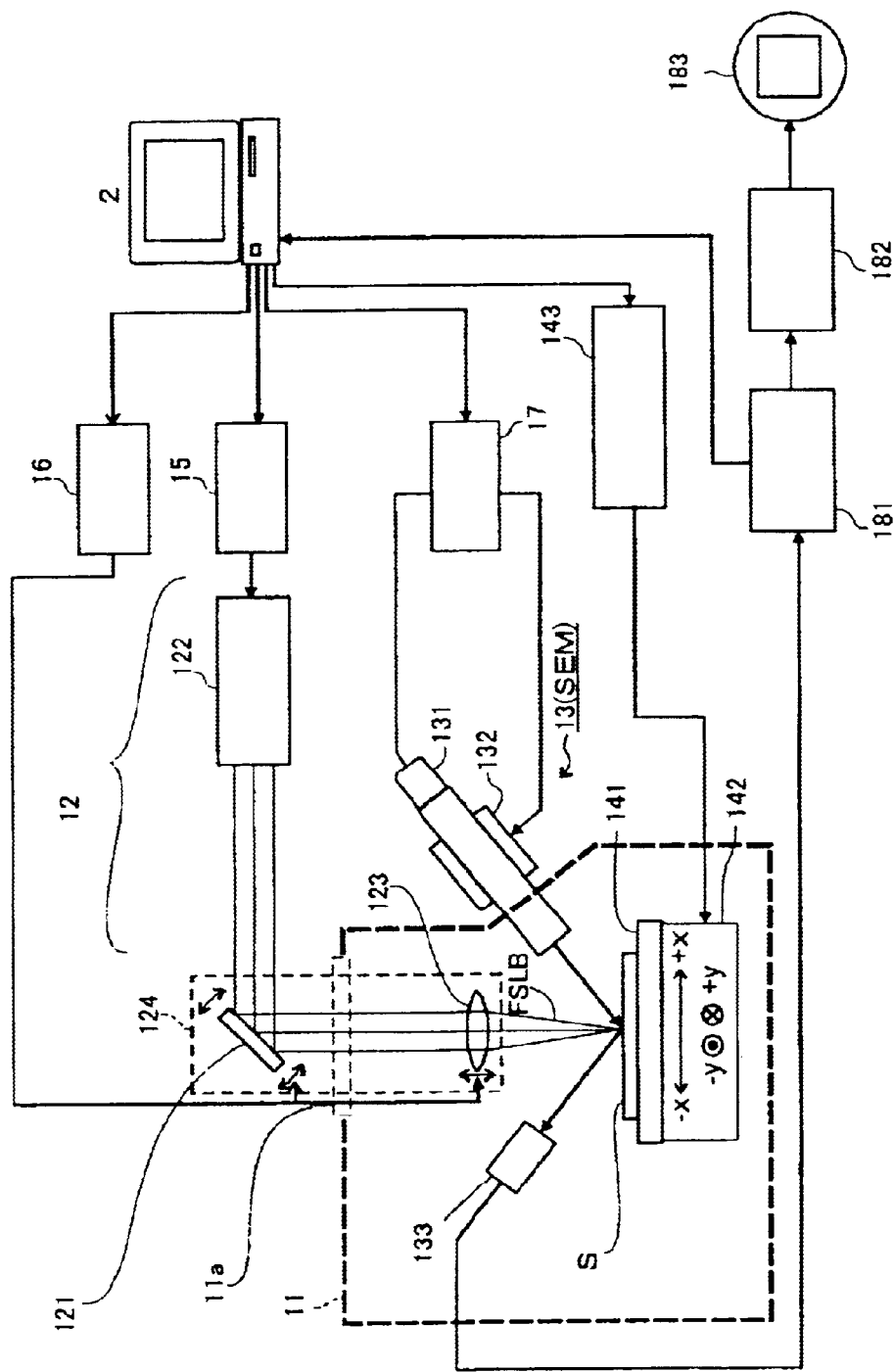
FIG. 2 is a system block diagram showing a semiconductor device inspecting apparatus using a TEM as an electron microscope in detail.

In FIG. 1, a semiconductor device that is a sample is accommodated in a vacuum chamber 11 (see FIG. 2). This semiconductor device is a wafer halfway through a formation of a circuit or a wafer before dicing after the circuit is formed.

The vacuum chamber 11 is provided with a front chamber for sample 11b. A sample is set in the vacuum chamber 11 through the front chamber for sample 11b. In this embodiment, the vacuum chamber 11 is provided at its lower portion with a vacuum pump 11c, and at its upper portion with a glass window 11a for introducing laser beams. The glass window 11a is provided at its upper portion with an x-y scanning galvanometer mirror 121 which constitutes a portion of the femtosecond laser apparatus 12.

In FIG. 1, the galvanometer mirror 121 is illustrated as two mirror elements 121a and 121b for the sake of convenience. By adjusting angles of these mirror elements 121a and 121b, an optical path of the femtosecond laser beams FSLB can be finely adjusted, and a predetermined position on a sample surface can be irradiated with laser beams FSLB.

An SEM (scanning electron microscope) 13 is mounted to the vacuum chamber 11. With this SEM 13, it is possible to observe a cross section of the sample cut by the laser beams FSLB.

FIG. 2 is a system block diagram showing the semiconductor device Inspecting apparatus 1 in detail.

In FIG. 2. a stage 141 in which a sample S is set is provided in the vacuum chamber 11. The stage 141 can move on an x-y plane (i.e. the stage 141 can move in +x, -x directions, +y, -y directions) with rough precision by means of an actuator 142. This actuator 142 may be a piezo-actuator, and it may be possible to control its position in a z direction (e.g., vertical direction in FIG. 2). The actuator 142 is driven by a stage driving circuit 143.

A glass window 11a is provided perpendicularly above the stage 141 of the vacuum chamber 11. A focus adjusting lens system 123 of the femtosecond laser beams FSLB is provided between the glass window 11a and the stage 141. Although the focus adjusting lens system 123 is provided in the vacuum chamber 11 in FIG. 2, a portion or all of the focus adjusting lens system 123 may be provided outside the vacuum chamber 11. A galvanometer mirror 121 (shown as one mirror in FIG. 2) is provided outside the glass window 11a. The galvanometer mirror 121 constitutes an x-y fine control system, and constitutes a laser optical system 124 together with the focus adjusting lens system 123.

In this embodiment, a femtosecond laser generating section 122 for generating of femtosecond width pulse is provided outside the vacuum chamber 11, and the femtosecond laser generating section 122 and the laser optical system 124 constitute the femtosecond laser apparatus 12.

The femtosecond laser apparatus 12 is driven by a laser driving circuit 15. The irradiation point control circuit 16 highly precisely controls the femtosecond laser beams FSLB. The Irradiation point control circuit 16 sends out an x-y control signal to the galvanometer mirror 121, thereby x-y controlling the laser irradiation point (controlling plane), and sends a z control signal to the focus adjusting lens system 123, thereby z controlling the irradiation point (controlling a depth).

A body of the SEM 13 is provided diagonally above the stage 141. The body of the SEM 13 comprises an electron gun, system 131 and an electron lens system 132. The SEM 13 is driven by an SEM driving circuit 17.

Although it is not illustrated, the electron gun system 131 comprises a thermoelectric field discharge electron source, a suppressor, a pullout electrode, a control lens and ground. The electron lens system 132 comprises a two-stage electrostatic four-pole lens for beam-axis adjustment, an electrostatic capacitor lens, a two-stage electrostatic eight-pole lens for scan/non-point aberration correction, an electrostatic object lens and the like.

A detecting system 133 is provided diagonally above the stage 141 in a direction opposite from the body of the SEM 13. The detecting system 133 comprises a scintillation and a photomultiplier tube, and can detect reflected beams from the sample S of electron beams emitted by the electron gun system 131. A detection signal detected by the detecting system 133 is sent to the detection signal processing circuit 181, and a signal from the detection signal processing circuit 181 (comprising A/D converter circuit, an image information generating circuit and the like) is sent to a display signal generating circuit 182, and the display signal generating circuit 182 can display the cross section image of the sample S on a display 183.

In FIG. 2, a host computer 2 collectively controls the irradiation point control circuit 16, the laser driving circuit 15, the SEM driving circuit 17 and the stage driving circuit 143, and can store a detection signal (detection data) from the detection signal processing circuit 181 in an appropriate storing device (such as a hard disk).

In the system shown in FIG. 2, the sample S is set in the stage 141 in the vacuum chamber 11, and a predetermined portion of the sample S is cut by the femtosecond laser apparatus 12.

Figure 3:
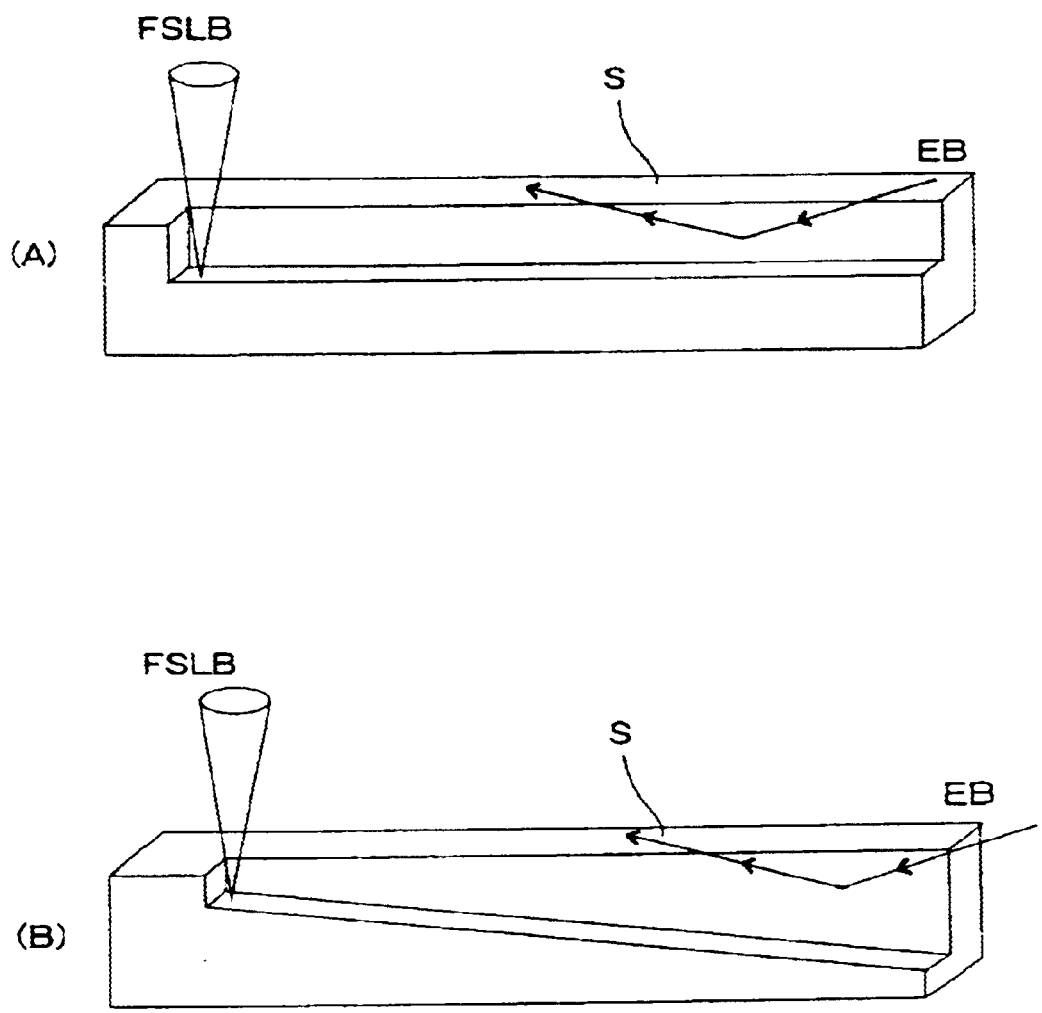

In this embodiment, the SEM 13 is used also as a position control monitor means at the time of cutting by adjusting the magnification. The cutting position is controlled by the actuator 142 and the galvanometer mirror 121, thereby cutting the predetermined portion, and the cut surface is irradiated with electron beams by the SEM 13 thereby observing the cut surface, and the cut surface is observed. FIGS. 3(A) and 3(B) show this cutting operation. At that time, the cutting depth can be made uniform by focus adjustment of the femtosecond laser beams FSLB as shown in FIG. 3(A), or the cutting depth can be changed as shown in FIG. 3(B).

Figure 4:
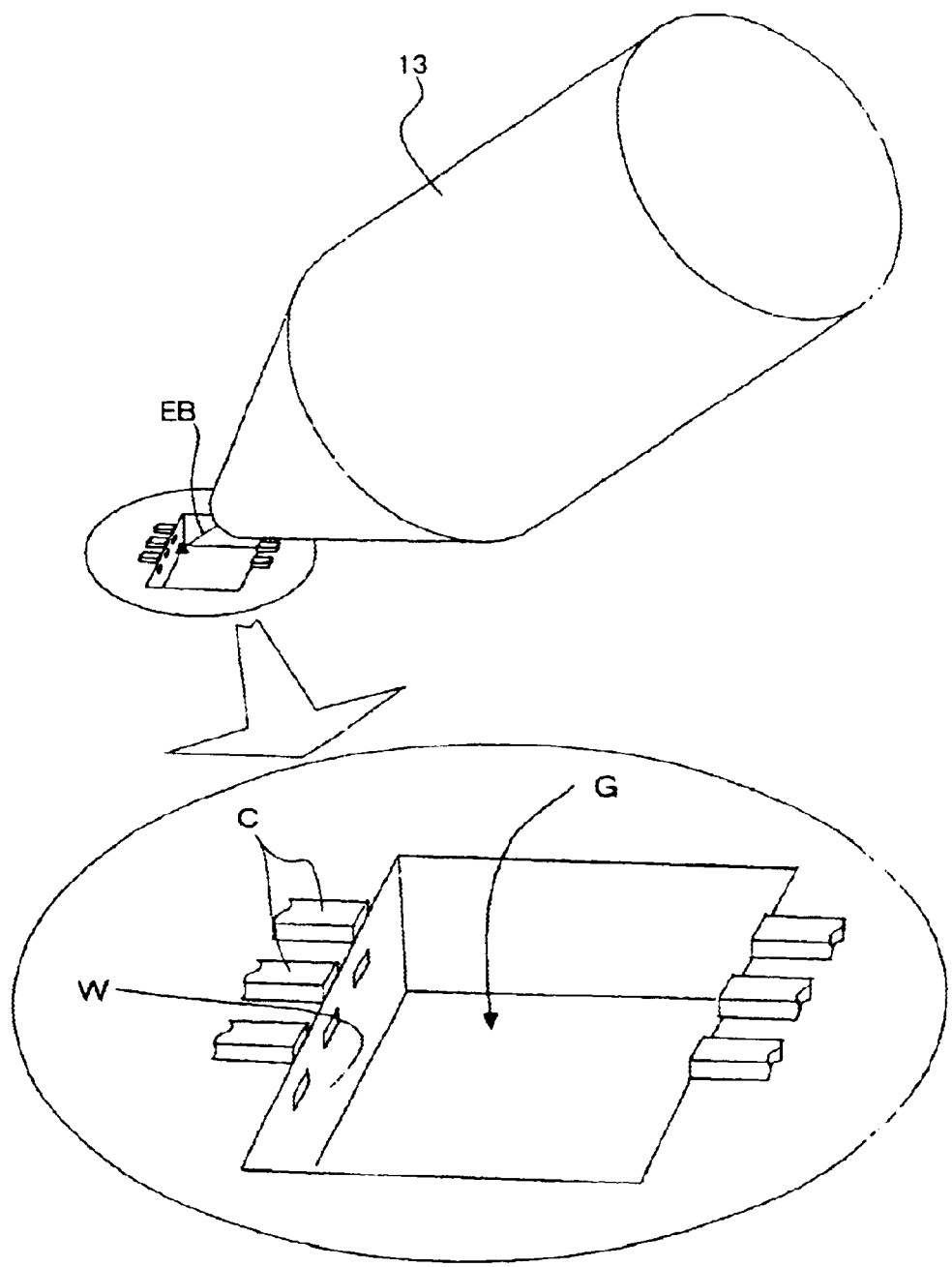
FIG. 4 is a diagram showing a detecting operation of a cut wall surface by an SEM in the system shown in FIG. 2.

FIG. 4 shows a detecting operation of the cut wall surface by means of the SEM 13. FIG. 4 shows a state in which a rectangular groove G is formed on the sample S formed with a circuit C by the laser beams FSLB from the femtosecond laser apparatus 12 shown in FIG. 2 and a wall surface W is observed using electron beams EB from the body of the SEM 12.

Figure 5:
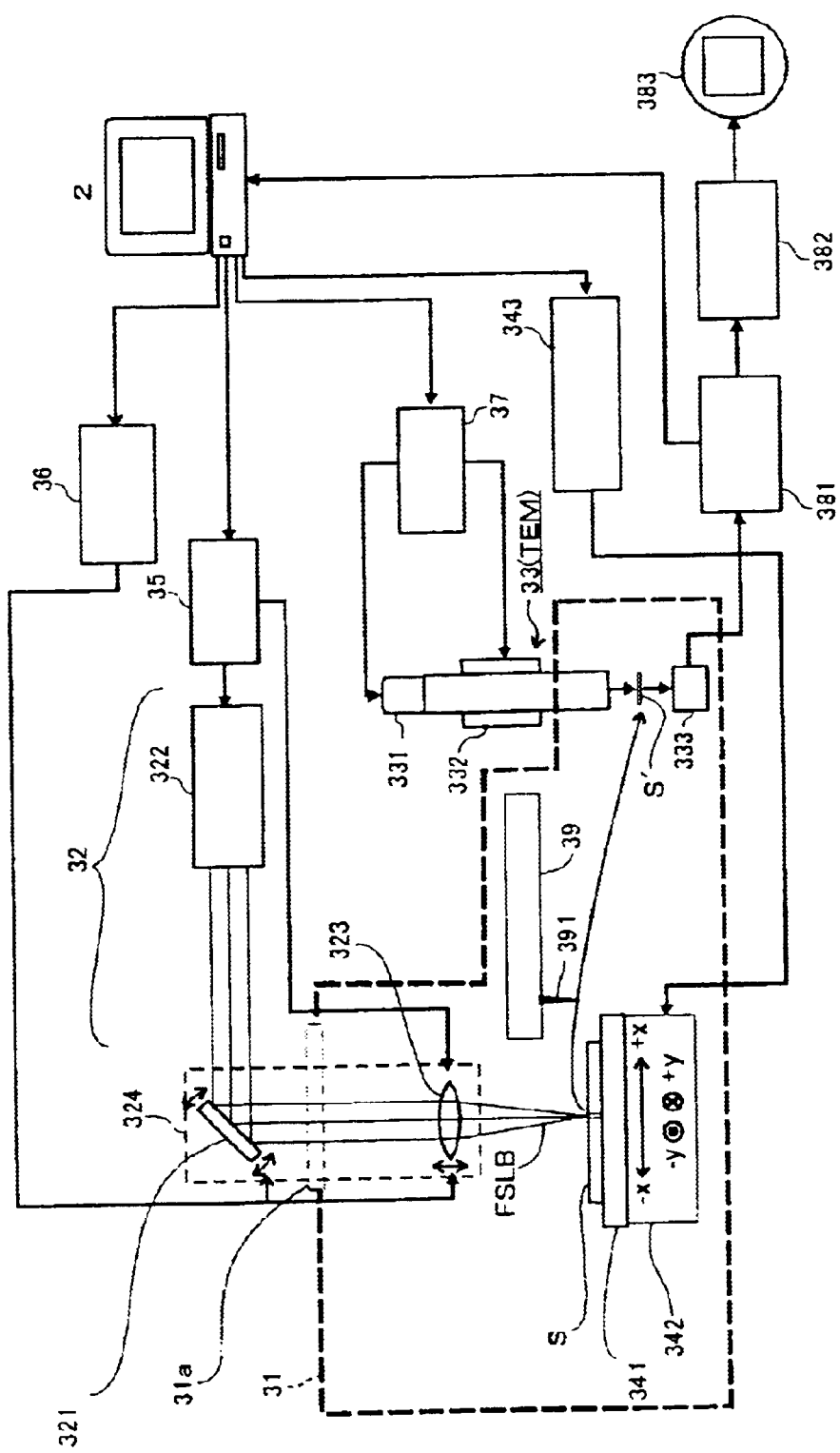
FIG. 5 is a system block diagram showing the semiconductor device inspecting apparatus using a TEM as the electron microscope in detail.
Figure 6:
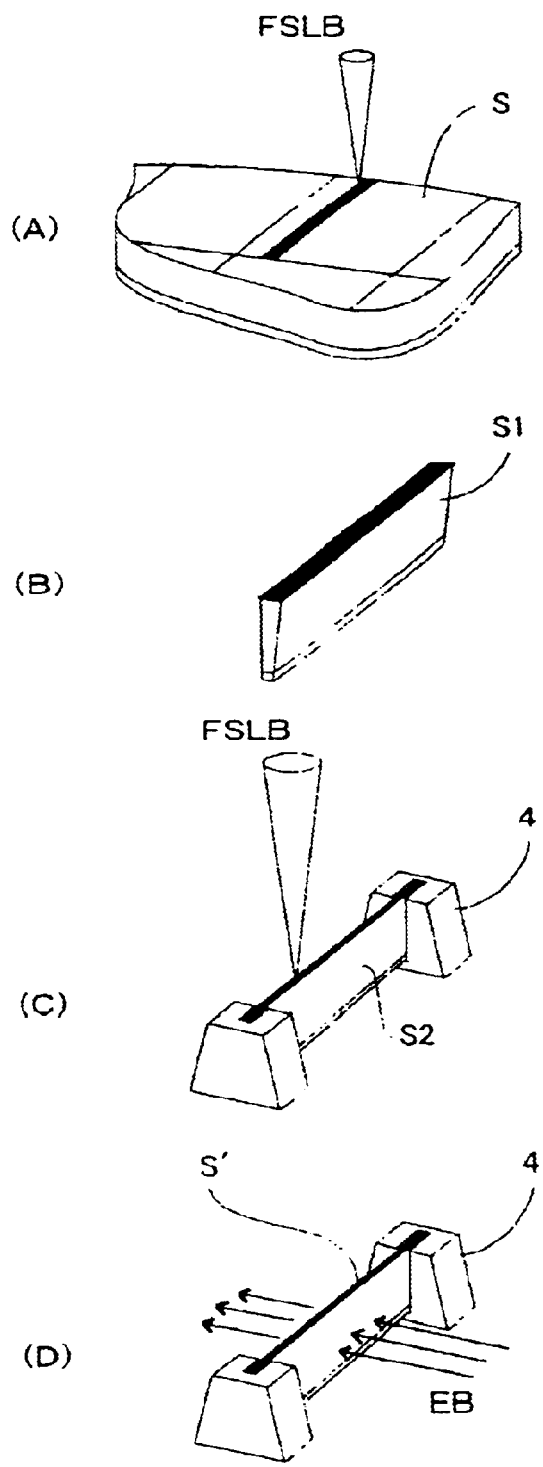

Another embodiment of the present invention will be explained with reference to FIGS. 5 and 6. FIG. 5 is a system block diagram showing the semiconductor device inspecting apparatus using a TEM (transmission electron microscope) as the electron microscope. An outer appearance of the semiconductor device inspecting apparatus using the TEN (transmission electron microscope) is substantially the same as that of the semiconductor device inspecting apparatus 1 using the SEM (scanning electron microscope) and thus, explanation thereof is omitted.

In FIG. 5, a stage 341 on which a sample S is set is provided in a vacuum chamber 31. The stage 341 and an actuator 342 which drives the stage 341 are respectively the same as the stage 141 and the actuator 142 shown in FIG. 2, and they are driven by a stage driving circuit 343.

Like the vacuum chamber 11 shown in FIG. 2. a glass window 31a is provided perpendicularly above the stage 341 of the vacuum chamber 31. A focus adjusting lens system 323 of the femtosecond laser beams FSLB is provided between the glass window 31a and the stage 341. A galvanometer mirror 321 is provided outside the glass window 31a, which constitutes a laser optical system 324 together with the focus adjusting lens system 323.

In this embodiment, like the system shown in FIG. 2. a femtosecond laser generating section 322 is provided outside the vacuum chamber 31. The femtosecond laser generating section 322 and the laser optical system 324 constitute a femtosecond laser apparatus 32. The femtosecond laser apparatus 32 is driven by a laser driving circuit 35. An irradiation point control circuit 36 highly precisely controls the femtosecond laser beams FSLB. The irradiation point control circuit 36 sends out an x-y control signal to the galvanometer mirror 321 to x-y control (plane control) of the laser irradiation point, and sends a z control signal to the focus adjusting lens system 323 to z control (depth control) of the irradiation point. A structure of the femtosecond laser apparatus 32 of this embodiment is the same as that of the femtosecond laser apparatus 12 shown in FIG. 2.

In this embodiment, a manipulator 39 is provided in the vicinity of the stage 341. The manipulator 39 can pick up a portion (sample piece S') of the sample S cut by the femtosecond laser beams FSLB with a probe 391, and can move the same to an observing position by a TEM 33. The TEM 33 comprises an electron gun system 331, an electron lens system 332 and a detecting system 333. The detecting system 333 can detect electron beams from the electron lens system 332 through which the sample S passes.

A detection signal detected by the detecting system 333 is sent to detection signal processing circuit 381. A signal from the detection signal processing circuit 381 (comprising an A/D converter circuit, an image information generating circuit and the like) is sent to a display signal generating circuit 382, and the display signal generating circuit 382 can display a composition image of the sample piece S' on the display 383.

In FIG. 5, the host computer 2 collectively controls an irradiation point control circuit 36, a laser driving circuit 35, a TEM driving circuit 37 and the stage driving circuit 343, and can store a detection signal (detection data) from the detection signal processing circuit 381 in a storing device (hard disk or the like).

Operation of the system shown in FIG. 5 will be explained with reference to FIGS. 6(A) to 6(D).

First, a sample S is set in the stage 341 in the vacuum chamber 31. As shown in FIG. 6(A), the femtosecond laser apparatus 32 cuts a predetermined portion of the sample S for taking out such a portion. In this embodiment, the femtosecond laser apparatus 32 can be provided with position control monitor means (not shown). The sample S is cut by controlling the cutting position using the actuator 342 and the galvanometer mirror 321 as mentioned above.

Next, as shown in FIG. 6(B), a probe 391 of the manipulator 39 picks up a sample piece (S1). Then, a sample piece S1 is set on the sample fixer 4 as shown in FIG. 6(C) and a thin film of the sample piece S1 is worked by femtosecond laser beams FSLB, thereby forming a thin film sample piece S2.

Then, as shown in FIG. 6(D), the thin film sample piece (S2) is sent to the observing position of the TEM 33 as a sample piece S' and electron beams are allowed to pass through the cut surface to observe the cut surface.

According to the present invention, since a sharp working surface can be formed, a precise inspection can be carried out, and a semiconductor device is worked within a short time and thus, the inspection efficiency can be enhanced.

Further, since the laser generating section of the femtosecond laser can be provided outside the chamber, a structure of the semiconductor devices inspecting apparatus can be simplified. And the working surface can be cut and observed at the same time easily.

Since laser is used for cutting a sample (i.e., ion beams are not used), influence on atmosphere in the chamber is small, and uniform cutting state can always be realized.

What is claimed is:

1. A semiconductor device inspecting apparatus, comprising:
   a chamber,
   a stage situated in the chamber for placing a semiconductor device thereon,
   a femtosecond laser apparatus including a laser generating section for generating laser beams disposed outside the chamber, and a laser optical system for introducing the laser beams generated at the laser generating section into the chamber, said laser generating section generating femtosecond width pulse and a strength so that the semiconductor device on the stage is cut by the laser beams introduced inside the chamber, and
   an electron microscope disposed inside the chamber for observing the semiconductor device cut by the laser beams.

2. A semiconductor device inspecting apparatus according to claim 1, wherein said electron microscope is disposed adjacent to the stage so that the semiconductor device being cut by the laser beams is observed simultaneously.

3. A semiconductor device inspecting apparatus according to claim 2, wherein said electron microscope includes an electron gun system for ejecting beams, an electron lens system situated adjacent to the electron gun system to provide the beams to the semiconductor device, anti a detecting system disposed inside the chamber for receiving the beams reflected by the semiconductor device.

4. A semiconductor device inspecting apparatus according to claim 2, further comprising a manipulator situated inside the chamber for moving a part of the semiconductor device cut by the femtosecond laser beams inside the chamber.

5. A semiconductor device inspecting apparatus according to claim 4, wherein said electron microscope is a transmission electron microscope having an electron gun system, electron lens system and a detecting system, said manipulator moving the part of the semiconductor device on the detecting system.

* * * * *